US011156478B2

(12) United States Patent
Takano et al.

(10) Patent No.: US 11,156,478 B2
(45) Date of Patent: Oct. 26, 2021

(54) MAGNETIC SENSOR

(71) Applicant: TDK Corporation, Tokyo (JP)

(72) Inventors: Kenichi Takano, Tokyo (JP); Yuta Saito, Tokyo (JP); Hiraku Hirabayashi, Tokyo (JP)

(73) Assignee: TDK Corporation, Tokyo (JP)

(*) Notice: Subject to any disclaimer, the term of this patent is extended or adjusted under 35 U.S.C. 154(b) by 107 days.

(21) Appl. No.: 16/749,313

(22) Filed: Jan. 22, 2020

(65) Prior Publication Data
US 2020/0300667 A1 Sep. 24, 2020

(30) Foreign Application Priority Data

Mar. 19, 2019 (JP) .............................. JP2019-051596

(51) Int. Cl.
G01D 5/16 (2006.01)
(52) U.S. Cl.
CPC ...................................... G01D 5/16 (2013.01)
(58) Field of Classification Search
CPC ..... G01D 5/16; G01R 33/0052; G01R 33/007
See application file for complete search history.

(56) References Cited

U.S. PATENT DOCUMENTS

| 2004/0141261 A1* | 7/2004 | Hasegawa | G01R 33/093 360/324.11 |
| 2010/0231213 A1* | 9/2010 | Nieuwenhuis | G01R 33/09 324/252 |
| 2011/0227560 A1* | 9/2011 | Haratani | G01R 33/093 324/117 R |

FOREIGN PATENT DOCUMENTS

JP 2009-162499 A 7/2009

* cited by examiner

Primary Examiner — Alvaro E Fortich
(74) Attorney, Agent, or Firm — Posz Law Group, PLC

(57) ABSTRACT

Magnetic sensor 1 has MR elements 11A to 14A that are connected to each other. MR elements 11A to 14A belongs either to group G1 in which electric resistance increases when the magnetization direction of each free layer 26 is rotated a predetermined angle in a same direction, or to group G2 in which the electric resistance decreases when the magnetization direction of each free layer 26 is rotated the predetermined angle in the same direction. A variation of an output of magnetic sensor 1 due to an increase of the electric resistance of the electric resistance elements of one group and a variation of the output of magnetic sensor 1 due to a decrease of the electric resistance of the electric resistance elements of another group are cancelled out.

16 Claims, 15 Drawing Sheets

FIG. 11A
FIG. 11B
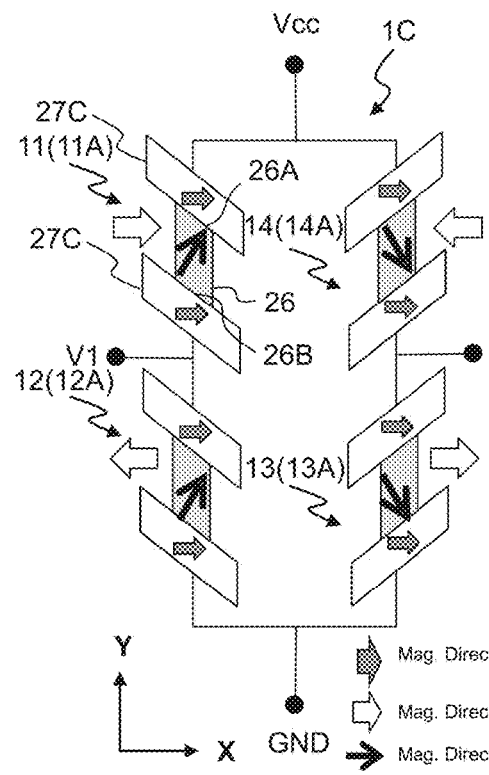
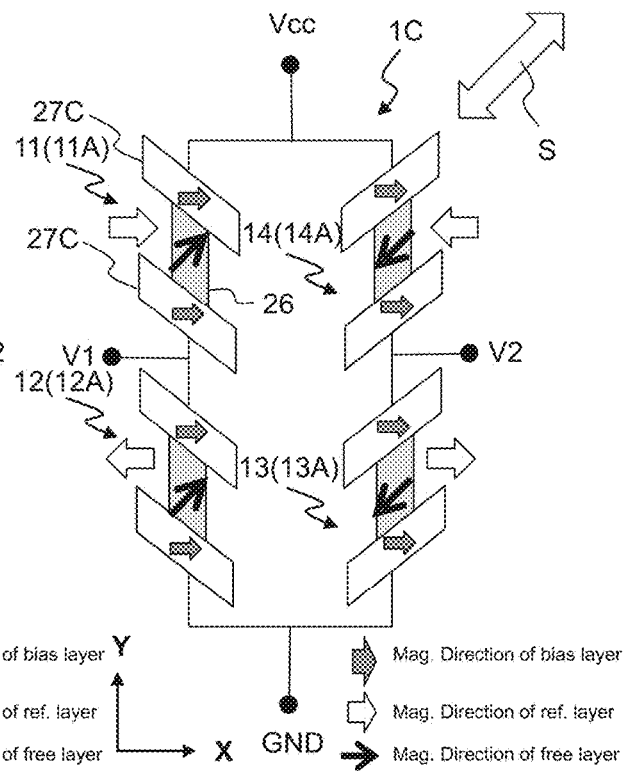
FIG. 11C
FIG. 11D
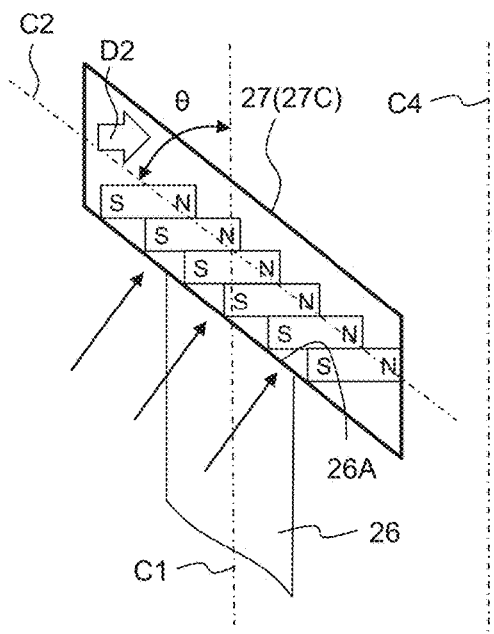
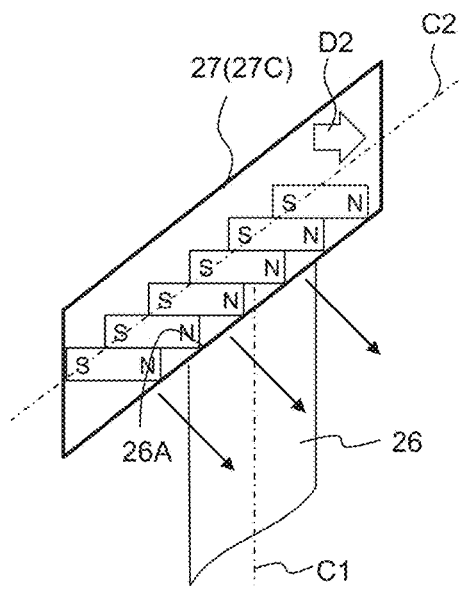

MAGNETIC SENSOR

BACKGROUND OF THE INVENTION

Field of the Invention

The present application is based on and claims priority from JP2019-051596, filed on Mar. 19, 2019, the disclosure of which is hereby incorporated by reference herein in its entirety.

The present invention relates to a magnetic sensor, particularly to a magnetic sensor that uses a magnetoresistive effect element.

Description of the Related Art

A magnetic sensor having a magnetoresistive effect element detects an external magnetic field based on the change of electric resistance that is caused by a magnetoresistive effect. A magnetic sensor that uses the magnetoresistive effect element has a higher output and sensitivity to a magnetic field than other magnetic sensors and is easy to miniaturize. A magnetic sensor that is disclosed in JP 2009-162499 has a magnetically free layer (hereinafter, referred to as a free layer) whose magnetization direction changes depending on an external magnetic field, a non-magnetic layer that exhibits the magnetoresistive effect (hereinafter, referred to as a spacer layer) and a magnetically pinned layer whose magnetization direction is pinned relative to the external magnetic field (hereinafter, referred to as a reference layer). In order to stabilize the magnetization direction of the free layer when no external magnetic field is applied, permanent magnetic layers that apply a bias magnetic field (hereinafter referred to as bias magnets) are provided on both sides of the free layer.

SUMMARY OF THE INVENTION

A magnetic sensor is subjected to various types of stress during and after manufacture. When no external magnetic field is applied, the magnetization direction of the free layer is pinned in a predetermined direction by bias magnets, but when it is subjected to stress, the magnetization direction varies due to an inverse magnetostrictive effect. The variation of the magnetization direction may affect the electric resistance of the magnetoresistive effect element, as well as the output of the magnetic sensor that is under a state where no external magnetic field is applied. However, the stress that is exerted on the magnetic sensor is often unpredictable, and the stress is difficult to control even if it is predictable. Therefore, in order to ensure the accuracy of the magnetic sensor, it is preferable that the output of the magnetic sensor be less sensitive to stress when no external magnetic field is applied.

It is an object of the present invention to provide a magnetic sensor whose output is less sensitive to stress when no external magnetic field is applied.

Claim 1

According to the present invention, it is possible to provide a magnetic sensor whose output is less sensitive to stress when no external magnetic field is applied.

The above and other objects, features and advantages of the present invention will become apparent from the following description with reference to the accompanying drawings which illustrate examples of the present invention.

BRIEF DESCRIPTION OF THE DRAWINGS

FIGS. 11A to 11D are views schematically illustrating the configuration of a magnetic sensor according to the fourth embodiment of the present invention;

DETAILED DESCRIPTION OF THE INVENTION

Figure 1A:
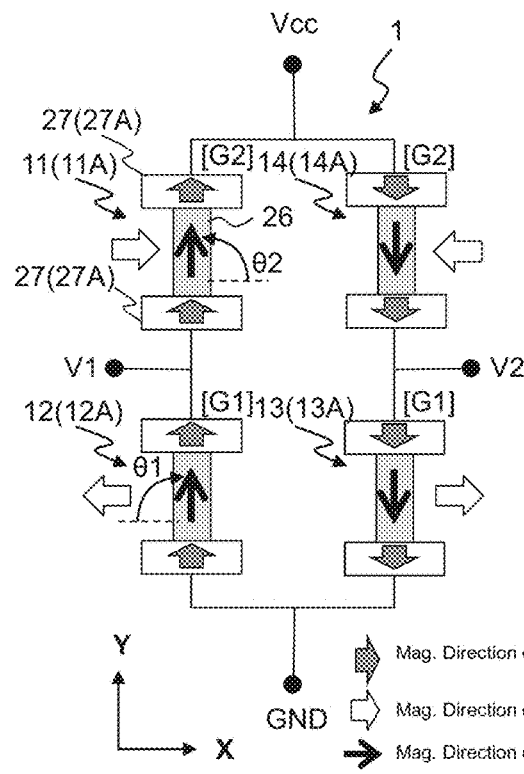
FIGS. 1A-1D are views schematically illustrating the configuration of a magnetic sensor according to the first embodiment of the present invention.
Figure 1C:
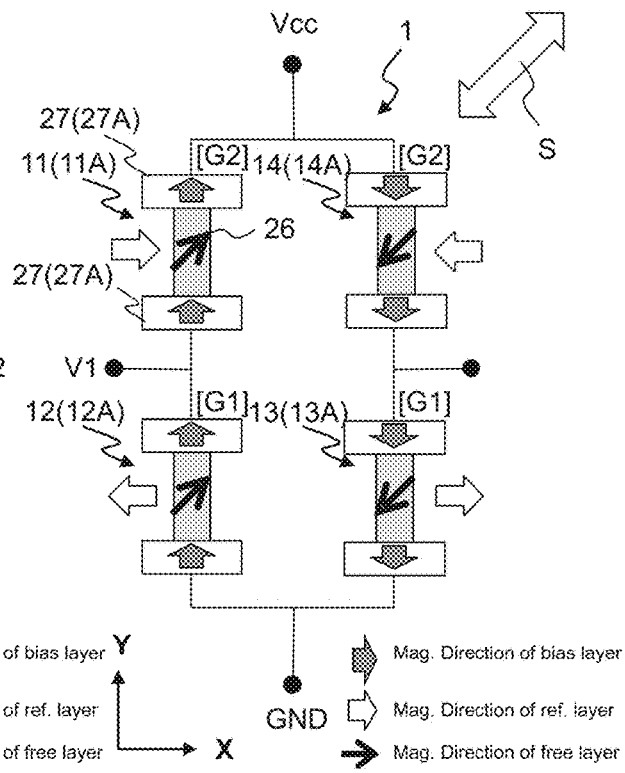

Referring now to the drawings, a magnetic sensor according to some embodiments of the present invention will be described. In the following descriptions and the drawings, the X direction corresponds to the magnetization direction of the free layer and the pinned layer, as well as the minor axis direction of the reference layer. The Y direction is a direction perpendicular to the X direction and corresponds to the longitudinal axis direction of the free layer. The Z direction is a direction perpendicular both to the X direction and the Y direction, and corresponds to the stacking direction of the multilayer film of the MR element (the magnetoresistive effect element). The directions of arrows that indicate the X, Y and Z directions in each drawing may be referred to as the +X direction, the +Y direction and the +Z direction, and the directions opposite to the arrows may be referred to as the −X direction, the −Y direction and the −Z direction.

First Embodiment

FIG. 1A shows the schematic configuration of magnetic sensor 1 according to the first embodiment. Magnetic sensor 1 has four electric resistance elements (hereinafter, referred to as first electric resistance element 11, second electric resistance element 12, third electric resistance element 13 and fourth electric resistance element 14), and electric resistance elements 11 to 14 are connected to each other by a bridge circuit (the Wheatstone bridge). The four electric resistance elements 11-14 are divided into two sets 11, 12 and 13, 14, and electric resistance elements 11, 12 and electric resistance elements 13, 14 in each set are connected in series, respectively. First electric resistance element 11 and fourth electric resistance element 14 are connected to supply voltage Vcc, and second electric resistance element 12 and third electric resistance element 13 are grounded (GND). The output voltage between first electric resistance element 11 and second electric resistance element 12 is outputted as midpoint voltage V1, and the output voltage between third electric resistance element 13 and fourth electric resistance element 14 is outputted as midpoint voltage V2. Therefore, midpoint voltages V1, V2 are obtained as follows, where the electric resistance of first to fourth electric resistance elements 11 to 14 are R1 to R4, respectively.

$$V_1 = \frac{R_2}{R_1 + R_2} V_{cc} \qquad \text{(Equation 1)}$$

$$V_2 = \frac{R_3}{R_3 + R_4} V_{cc} \qquad \text{(Equation 2)}$$

Figure 2A:
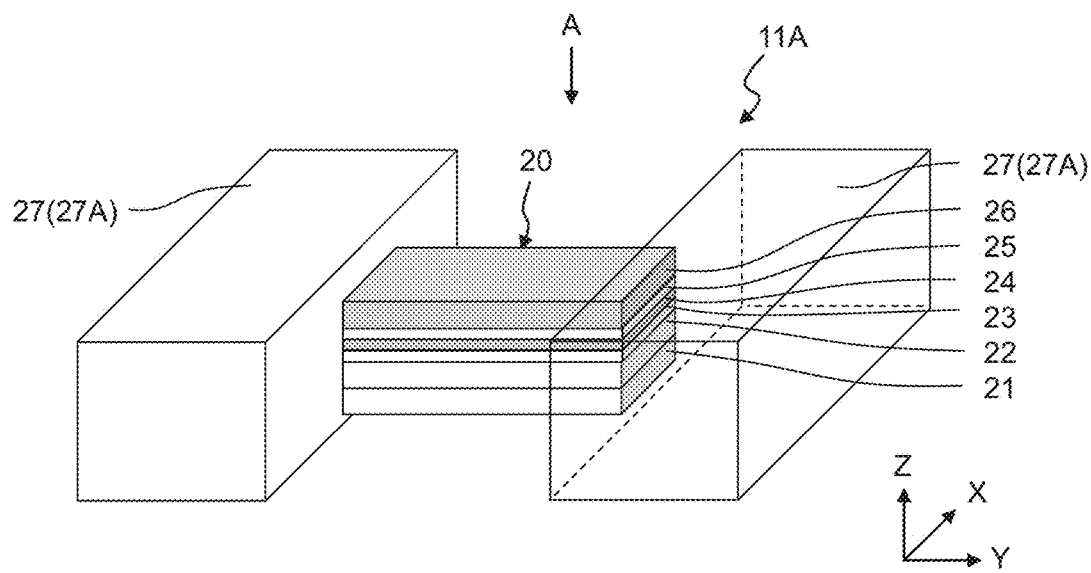
FIGS. 2A, 2B are views schematically illustrating the configuration of a MR element of the magnetic sensor shown in FIGS. 1A-1D.

First to fourth electric resistance elements 11 to 14 each include at least one MR (magnetoresistive) element. In the present embodiment, first to fourth electric resistance elements 11 to 14 each consist of a single MR element (hereinafter referred to as first to fourth MR elements 11A to 14A). Although not illustrated, first to fourth electric resistance elements 11 to 14 each may consist either of a plurality of MR elements that are connected in series or of a plurality of MR element groups that are connected in parallel, wherein each MR element group consists of a plurality of MR elements that are connected in series. Since first to fourth MR elements 11A to 14A have the same configuration, first MR element 11 will be described here. FIG. 2A shows a schematic perspective view of first MR element 11A. First MR element 11A has multilayer film 20 and a pair of bias magnets 27 that sandwiches multilayer film 20 in the Y-direction. Multilayer film 20 has a film structure of a typical spin-valve. Multilayer film 20 has a generally rectangular shape having short sides in the X direction and long sides in the Y direction, as viewed in the Z direction. Multilayer film 20 includes antiferromagnetic layer 21, pinned layer 22, nonmagnetic intermediate layer 23, reference layer 24, spacer layer 25 and free layer 26, and these layers are stacked in this order. Multilayer film 20 is sandwiched by a pair of electrode layers (not illustrated) in the Z direction, so that sense current flows from one of the electrode layers to multilayer film 20 in the Z direction.

Free layer 26 is a magnetic layer that is magnetized in initial magnetization direction D1 (see FIG. 2B) when no external magnetic field is applied and whose magnetization direction changes (rotates) from initial magnetization direction D1 when an external magnetic field is applied. Free layer 26 may be formed, for example, of NiFe. Pinned layer 22 is a ferromagnetic layer whose magnetization direction is pinned relative to an external magnetic field due to exchange coupling with antiferromagnetic layer 21. Antiferromagnetic layer 21 may be formed of PtMn, IrMn, NiMn and the like. Reference layer 24 is a ferromagnetic layer that is sandwiched by pinned layer 22 and spacer layer 25, and is magnetically coupled, more specifically, antiferromagnetically coupled, to pinned layer 22 via nonmagnetic intermediate layer 23, such as Ru or Rh. Accordingly, magnetization directions of both reference layer 24 and pinned layer 22 are pinned relative to an external magnetic field, and these magnetization directions are antiparallel to each other. As a result, the magnetization direction of reference layer 24 is stabilized, and the magnetic field that is emitted from reference layer 24 is canceled by the magnetic field that is emitted from pinned layer 22, thereby a magnetic field that leaks to the outside is limited. Spacer layer 25 is a nonmagnetic layer that is located between free layer 26 and reference layer 24 and that exhibits the magnetoresistive effect. Spacer layer 25 is a nonmagnetic conductive layer that is made of a nonmagnetic metal, such as Cu, or a tunnel barrier layer that is made of a nonmagnetic insulator, such as $Al_2O_3$. When spacer layer 25 is a nonmagnetic conductive layer, first MR element 11A functions as a giant magnetoresistive effect (GMR) element, and when spacer layer 25 is a tunnel barrier layer, first MR element 11A functions as a tunneling magnetoresistive effect (TMR) element. First MR element 11A is preferably a TMR element because of a large MR change rate and an increased output voltage of the bridge circuit.

Figure 2B:
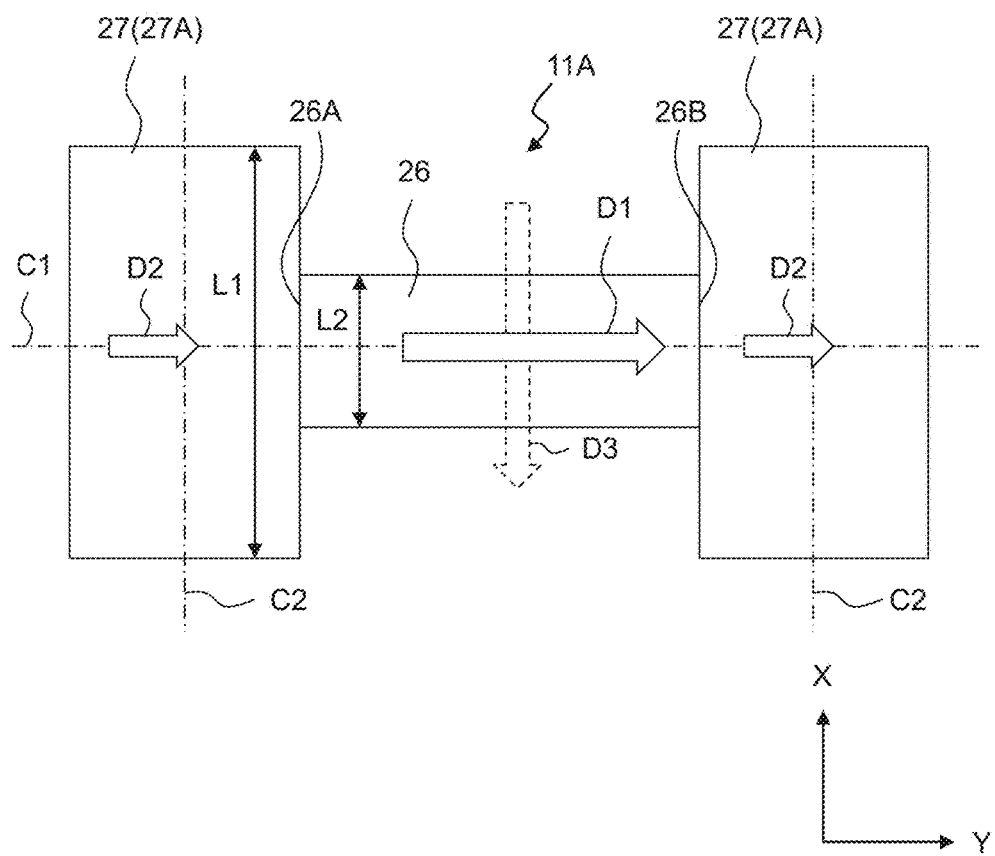
Figure 3A:
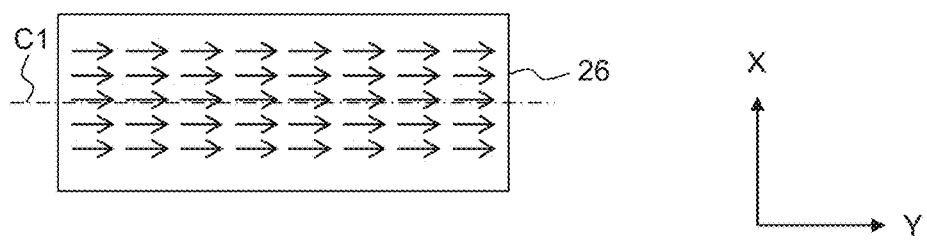
FIGS. 3A-3C are plan views conceptually illustrating the magnetization of the free layer, the reference layer and the pinned layer, respectively, when no external magnetic field is applied.
Figure 3B:
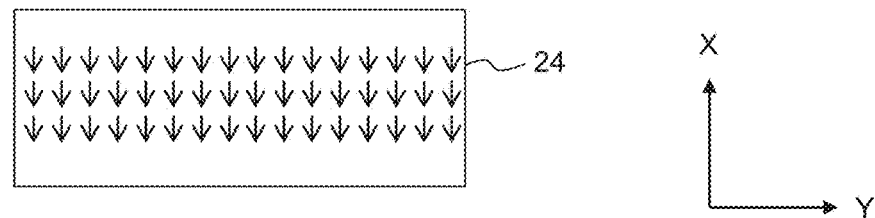
Figure 3C:
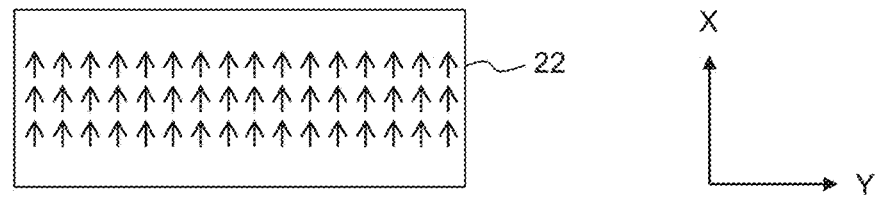

FIG. 2B shows a schematic plan view of first MR element 11A, as viewed from direction A in FIG. 2A. FIGS. 3A-3C conceptually illustrate the magnetization of free layer 26, reference layer 24 and pinned layer 22, respectively, when no external magnetic field is applied. The arrows in FIGS. 3A-3C schematically indicate the magnetization direction. Free layer 26 is magnetized by the bias magnetic field of bias magnets 27 in initial magnetization direction D1 that is substantially parallel to the longitudinal axis direction (the Y direction). Initial magnetization direction D1 of free layer 26 is substantially parallel to magnetization direction D2 of bias magnets 27. The longitudinal axis of free layer 26 in the Y-direction is referred to as central axis C1. Reference layer 24 is magnetized in magnetization direction D3, that is substantially parallel to the minor axis direction (X direction). When an external magnetic field is applied in the X direction, which is the magnetically sensing direction of free layer 26, the magnetization direction of free layer 26 rotates clockwise or counterclockwise in FIG. 2B in accordance with the direction and strength of the external magnetic field. As a result, the relative angles between magnetization direction D3 of reference layer 24 and the magnetization direction of free layer 26 change, and consequently, the electric resistance to the sense current changes.

Figure 4A:
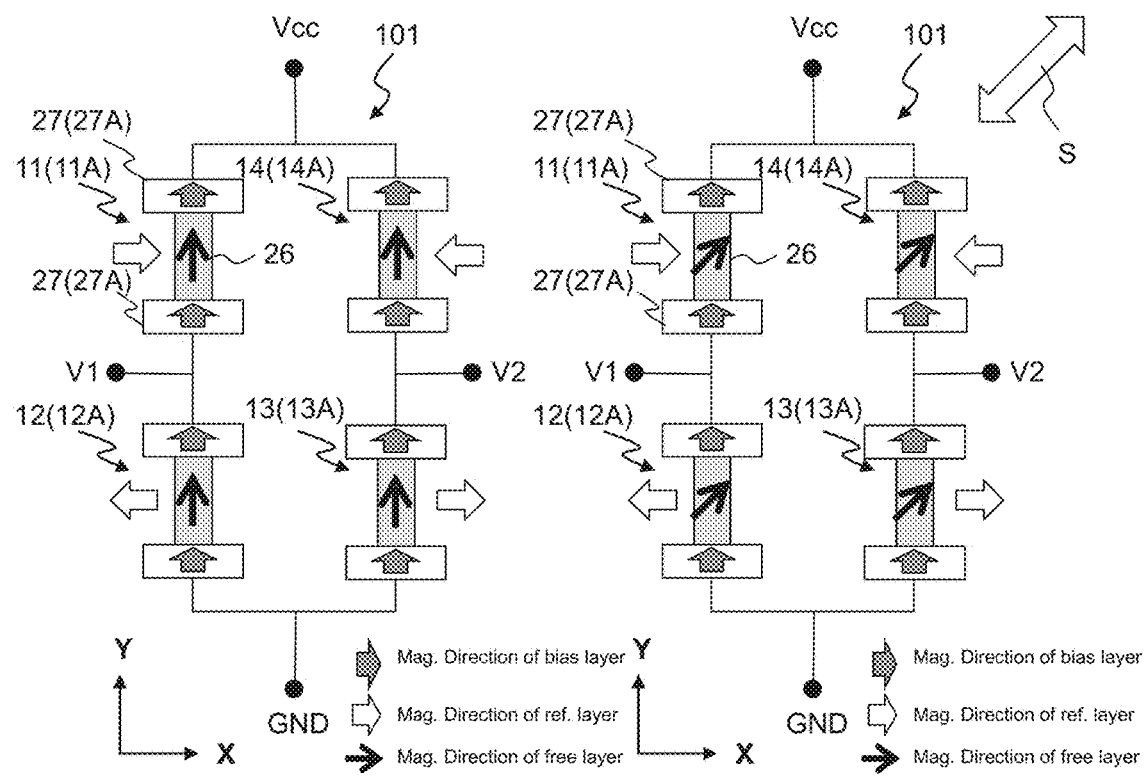
FIGS. 4A-4D are views schematically illustrating the configuration of a magnetic sensor of a comparative example.
Figure 4C:
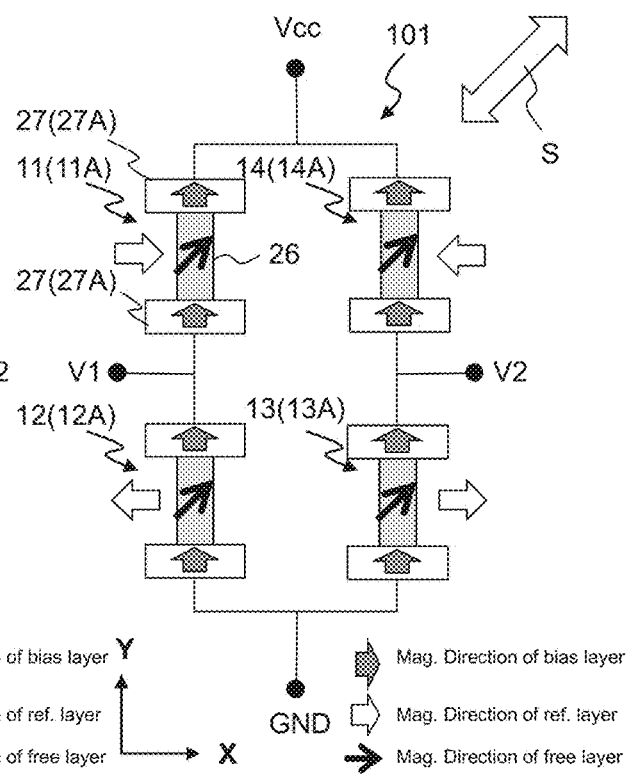
Figure 4B:
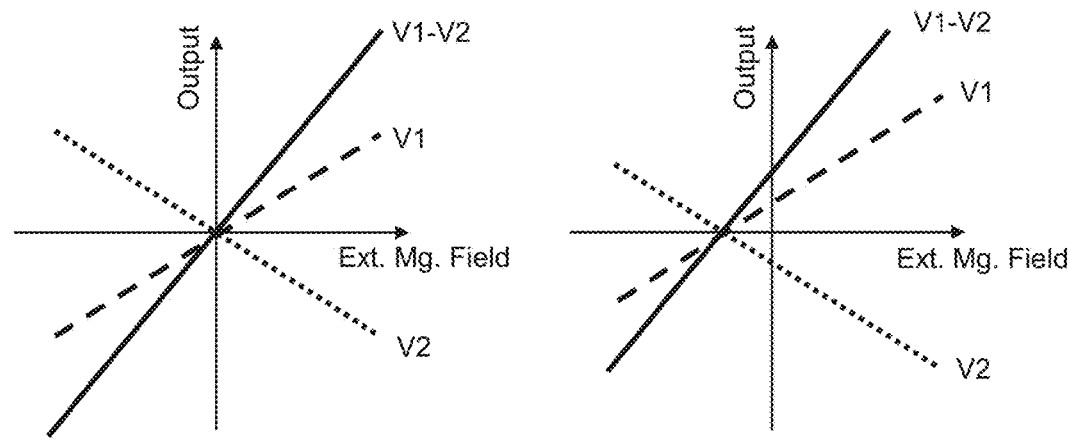

FIG. 4A is a view similar to FIG. 1A that illustrates the configuration of magnetic sensor 101 of a comparative example. Free layers 26 of first to fourth MR elements 11A to 14A are magnetized in the same initial magnetization direction. Reference layers 24 of first to fourth MR elements 11A to 14A are magnetized in the directions that are indicated by the arrows in the drawing. Therefore, when an external magnetic field is applied in the +X-direction, the electric resistance of first and third MR elements 11A, 13A decreases while the electric resistance of second and fourth MR elements 12A, 14A increases. As a result, midpoint voltage V1 increases and midpoint voltage V2 decreases, as shown in FIG. 4B. On the other hand, when an external magnetic field is applied in the X-direction, midpoint voltage V1 decreases and midpoint voltage V2 increases. When the difference V1-V2 between midpoint voltages V1, V2 is detected, this can result in doubling the sensitivity of the magnetic sensor, as compared to detecting midpoint voltages V1, V2. In addition, even if midpoint voltages V1, V2 are shifted in the same direction in FIG. 4B (for example, even if they are shifted upward), the influence can be removed by detecting the difference.

Figure 4D:
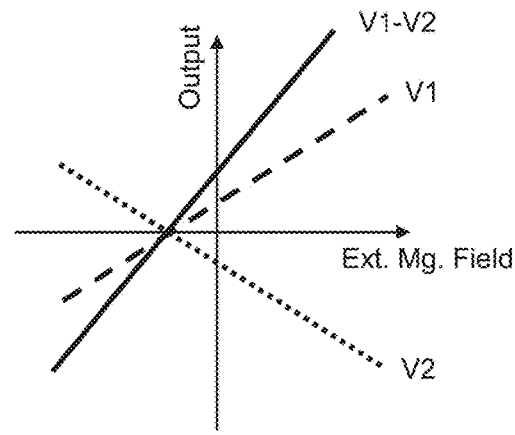

When first to fourth MR elements 11A to 14A are subjected to stress in the same direction, initial magnetization direction D1 of free layers 26 rotates due to the inverse magnetostrictive effect. In FIG. 4C, tensile stress S is applied to first to fourth MR elements 11A to 14A at angles of 45° relative to the X axis and the Y axis. The inverse magnetostrictive effect acts in different directions depending on whether the magnetostriction constant is positive or negative and whether the stress is tensile stress S or compressive stress. When tensile stress is applied and the magnetostriction constant of free layer 26 is positive, and when compressive stress is applied and the magnetostriction constant of free layer 26 is negative, initial magnetization direction D1 of free layer 26 rotates toward a direction that is parallel to the stress. When tensile stress is applied and the magnetostriction constant of free layer 26 is negative, and when compressive stress is applied and the magnetostriction constant of free layer 26 is positive, initial magnetization direction D1 of free layer 26 rotates toward a direction that is perpendicular to the stress. When tensile stress S is applied at angles of 45° in FIG. 4C, since initial magnetization direction D1 of free layers 26 of first and third MR elements 11A, 13A rotates toward magnetization direction D3 of reference layer 24, the electric resistance of first and third MR elements 11A, 13A decreases. Since initial magnetization direction D1 of free layers 26 of second and fourth MR elements 12A, 14A rotates toward a direction away from the magnetization direction of reference layer 24, the electric resistance of second and fourth MR elements 12A, 14A increases. As a result, midpoint voltage V1 increases while midpoint voltage V2 decreases, and V1-V2 increases, as shown in FIG. 4D. That is, output V1-V2 of magnetic sensor 101 in the state where no external magnetic field is applied is offset from zero due to the external stress. The offset of output V1-V2 affects the accuracy with which an external magnetic field is measured.

External stress is generated by a force that is exerted by a sealing resin or the like, for example, when a magnetic sensor is enclosed in a package. Stress is also generated when a magnetic sensor that is enclosed in a package is mounted on a substrate or the like for modularization (for example, in a soldering process). Stress may also occur in the process of incorporating the module into a product (for example, screwing). Thermal stress may also occur when the magnetic sensor is used as a part of a product, for example, due to a temperature change. Such stress is difficult to predict and to measure, and is also difficult to control. Thus, it is preferable that outputs V1, V2 be essentially less sensitive to external stress.

In the present embodiment, first to fourth electric resistance elements 11 to 14 (first to fourth MR elements 11A to 14A) belong to either first group G1 or second group G2. In first group G1, electric resistance of the elements increases or decreases when initial magnetization direction D1 of all free layers 26 rotates a predetermined angle (45 degrees in the illustrated example) in the same direction by external stress. In second group G2, electric resistance of the elements decreases when the electric resistance of the elements of first group G1 increases, and electric resistance of the elements increases when the electric resistance of the elements of first group G1 decreases. The MR elements that belong to first group G1 are referred to as MR elements of the first group, and the MR elements that belong to second group G2 are referred to as MR elements of the second group. For convenience of explanation, it is assumed here that the electric resistance of the MR elements that belong to first group G1 increases and that the electric resistance of the MR elements that belong to second group G2 decreases. Second and third MR elements 12A, 13A belong to first group G1, and first and fourth MR elements 11A, 14A belong to second group G2. As shown in FIG. 1A, in the MR elements of the first group (second and third MR elements 12A, 13A), initial magnetization direction D1 of free layers 26 is rotated first angle θ1 (0°<θ1 <180°, about 90° in the present embodiment) relative to magnetization direction D3 of reference layers 24 in the clockwise direction (in the first rotating direction). In the MR elements of the second group (first and fourth MR elements 11A, 14A), initial magnetization direction D1 of free layers 26 is rotated second angle θ2 (0°<θ2 <180°, about 90° in the present embodiment) relative to magnetization direction D3 of reference layers 24 in the counterclockwise direction (in the second rotating direction opposite to the first rotating direction). In other words, the directions of the outer products F×R of the MR elements of the first group and the MR elements of the second group are opposite to each other, where F is a vector that indicates initial magnetization direction D1 of free layer 26, and R is a vector that indicates magnetization direction D3 of reference layer 24.

Figure 1B:
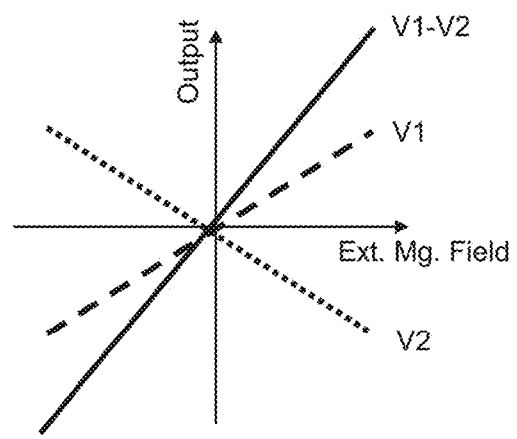
Figure 1D:
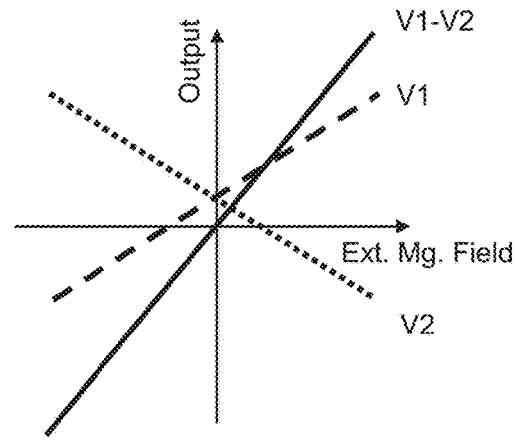

When tensile stress S is applied at angles of 45° in FIG. 10, initial magnetization direction D1 of free layers 26 of first and fourth MR elements 11A, 14A rotates toward magnetization direction D3 of reference layers 24, and the electric resistance of first and fourth MR elements 11A, 14A decreases. Initial magnetization direction D1 of free layers 26 of second and third MR elements 12A, 13A rotates toward a direction away from magnetization direction D3 of reference layer 24, and the electric resistance of second and third MR elements 12A, 13A increases. As shown in FIG. 1D, both midpoint voltage V1 and midpoint voltage V2 increase, and the change of V1-V2 is limited. That is, when external stress is applied, the offsets of outputs V1, V2 of the magnetic sensor can be reduced as compared to the comparative example.

External stress can be applied from all directions. Further, as described above, the external stress may be tensile or may be compressive. If the magnetostriction constant of free layer 26 is positive and tensile stress S is applied in the direction shown in FIG. 10, then second and third MR elements 12A, 13A belong to the MR elements of the first group, and first and fourth MR elements 11A, 14A belong to the MR elements of the second group, as described above. However, for example, if the magnetostriction constant of free layer 26 is positive and the tensile stress is applied in a direction that is perpendicular to the direction shown in FIG. 10, then first and fourth MR elements 11A, 14A belong to the MR elements of the first group, and second and third MR elements 12A, 13A belong to the MR elements of the second group. Thus, an unambiguous determination cannot be made as to which MR element belongs to which group. However, it should be noted that first and fourth MR elements 11A, 14A always belong to one group and second and third MR elements 12A, 13A always belong to another group.

Figure 5A:
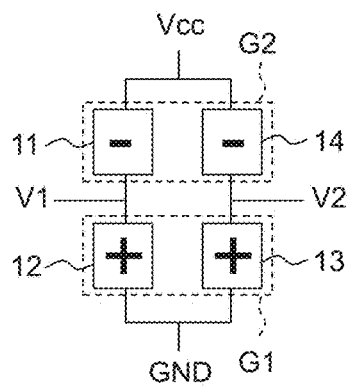
FIGS. 5A-5C are views conceptually illustrating the change of electric resistance of the MR sensors when stress is applied to the MR sensors.
Figure 5B:
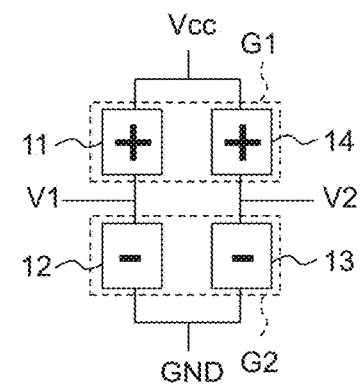
Figure 5C:
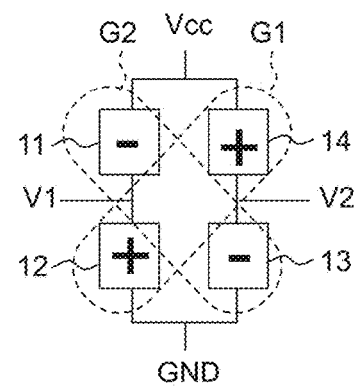

FIGS. 5A to 5C schematically show the change of the electric resistance of first to fourth MR elements 11A to 14A, wherein FIG. 5A corresponds to FIG. 10. Referring to FIG. 5A, the electric resistance of second and third MR elements 12A, 13A (first group G1) increases while the electric resistance of first and fourth MR elements 11A, 14A (second group G2) decreases, and both midpoint voltages V1, V2 increase. Referring to FIG. 5B, the electric resistance of second and third MR elements 12A, 13A (second group G2) decreases while the electric resistance of first and fourth MR elements 11A, 14A (first group G1) increases, and both midpoint voltages V1, V2 decrease. Whether the magnetic sensor is in the state of FIG. 5A or in the state of FIG. 5B depends on the external stress and the magnetostriction constant of free layer 26, but magnetic sensor 1 of the present embodiment is always either in the state of FIG. 5A or in the state of FIG. 5B. And in both cases, the offsets of outputs V1, V2 of the magnetic sensor are reduced. This is because first group G1 and second group G2 are arranged such that the variation of the output of the magnetic sensor due to the change of the electric resistance of the electric resistance elements of first group G1 and the variation of the output of the magnetic sensor due to the change of the electric resistance of the electric resistance elements of second group G2 are cancelled out. On the other hand, referring to FIG. 5C that corresponds to the comparative example shown in FIG. 4C, the electric resistance elements of first group G1 (second and fourth MR elements 12A, 14A) and the electric resistance elements of second group G2 (first and third MR elements 11A, 13A) are not arranged in the manner described above. Therefore, the offsets of outputs V1, V2 of the magnetic sensor tend to increase.

In the present embodiment, a pair of bias magnets 27 faces both ends 26A, 26B (see FIG. 2B) of free layer 26 with regard to initial magnetization direction D1, and central axes C2 of both bias magnets 27 are substantially perpendicular to central axis C1 of free layer 26. In the specification, such bias magnets 27 are referred to as end bias magnets 27A. Free layers 26 of some of the MR elements (first and second MR elements 11A, 12A) and free layers 26 of the other MR elements (third and fourth MR elements 13A, 14A) are magnetized in directions substantially antiparallel to each other. That is, end bias magnets 27A of some of the MR elements (first and second MR elements 11A, 12A) and end bias magnets 27A of the other MR elements (third and fourth MR elements 13A, 14A) are magnetized in directions substantially antiparallel to each other. The term "antiparallel" means that the directions differ in the range of 160° to 200°.

Figure 6A:
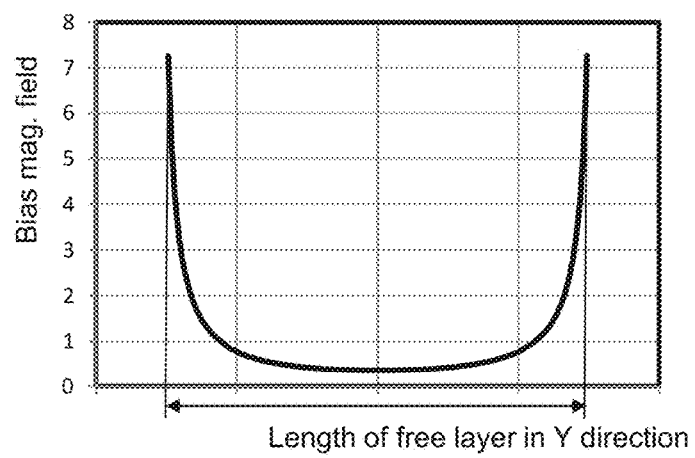
FIGS. 6A, 6B are views illustrating a bias magnetic field that is applied to the free layer and the magnetizations of the free layer of the magnetic sensor in the first embodiment.
Figure 6B:
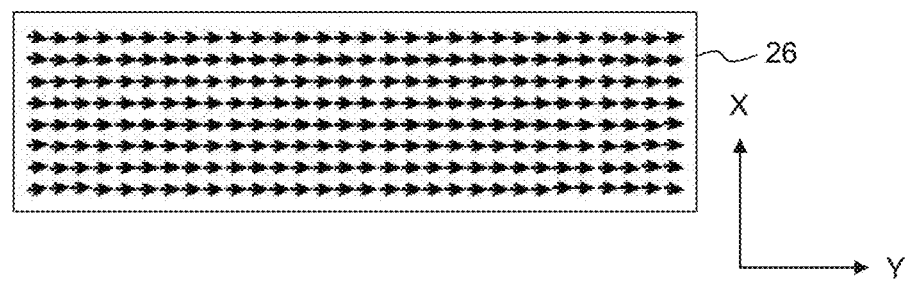

In order to magnetize end bias magnets 27A in different directions for each MR element, some of end bias magnets 27A and the other end bias magnets 27A are formed of materials having different coercive force. For example, end bias magnets 27A of first and second MR elements 11A, 12A are formed of CoPt or of a material that is obtained by adding at least one element from among Cr, B and Ta to CoPt, and end bias magnets 27A of third and fourth MR element 13A, 14A are formed of FePt or of a material that is obtained by adding at least one element from among Ni, Nb, Cu, Ag, Mo and Ti to FePt. The coersive force of the former is 1500 to 5000 Oe, and the coersive force of the latter is 5000 to 13000 Oe. First, all end bias magnets 27A are magnetized by a magnetic field that exceeds the coersive force of all end bias magnets 27A (for example, a magnetic field of 15000 Oe or more). As a result, all end bias magnets 27A are magnetized in the same direction. Next, a magnetic field between the former coersive force and the latter coersive force (for example, a magnetic field around 7500 Oe) is applied in the opposite direction. End bias magnets 27A of first and second MR elements 11A, 12A are magnetized in the opposite direction by the magnetic field that is newly applied, but the magnetization direction of end bias magnets 27A of third and fourth MR elements 13A, 14A remains unchanged. As a result, end bias magnets 27A can be magnetized in different directions for each MR element FIG. 6A shows the distribution of a normalized bias magnetic field in longitudinal direction Y of free layer 26. FIG. 6B shows the distribution of the initial magnetization of free layer 26, wherein the initial magnetization direction at each position of free layer 26 is indicated by the arrows. In general, free layer 26 tends to be magnetized in directions other than longitudinal direction Y at the longitudinal ends thereof, but in the present embodiment, the magnetization direction of free layer 26 is aligned in longitudinal direction Y over the entire length of longitudinal direction Y. This is because bias magnets 27 are located at both ends of free layer 26 with regard to longitudinal direction Y, and therefore an especially strong bias magnetic field is applied to both ends of free layer 26 with regard to longitudinal direction Y. Further, in the present embodiment, dimension L1 of end bias magnets 27A is larger than dimension L2 of free layer 26 in the X direction that is perpendicular to initial magnetization direction D1, as shown in FIG. 2B. This also causes a strong bias magnetic field to be applied to both ends of free layer 26 with regard to longitudinal direction Y, and free layer 26 is easily magnetized in longitudinal direction Y at both ends thereof with regard to longitudinal direction Y.

Second Embodiment

Figures 7A, 7B:
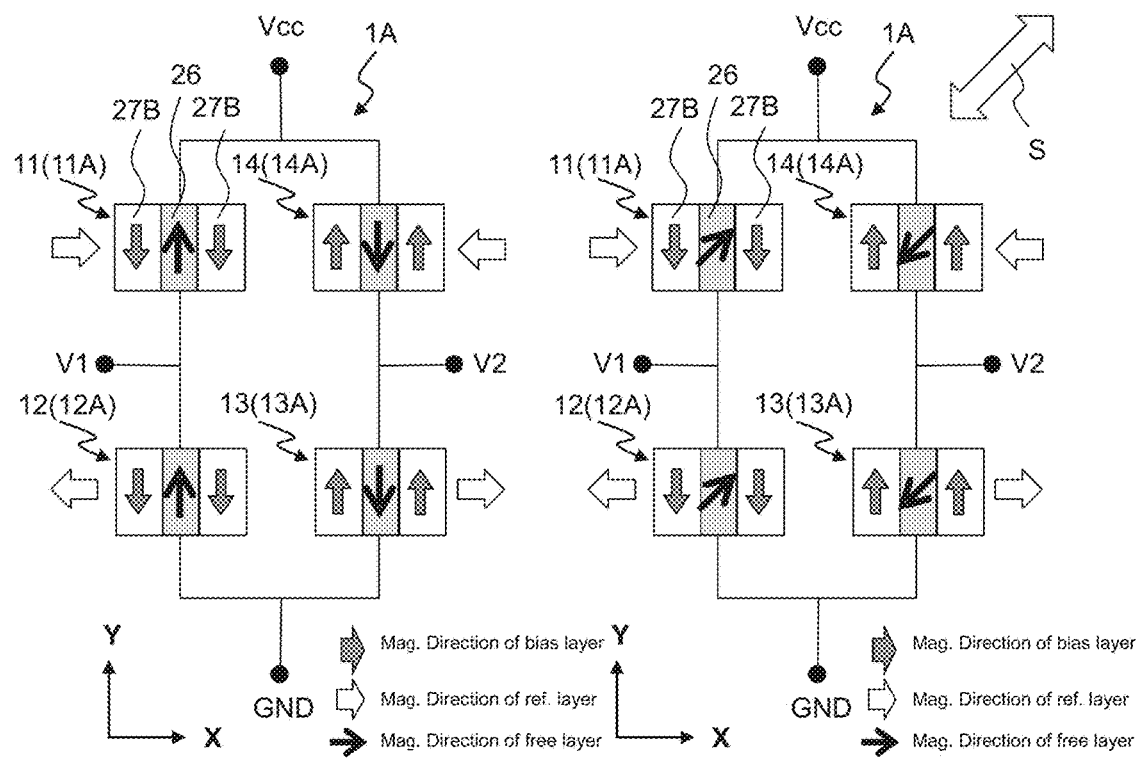
FIGS. 7A, 7B are views schematically illustrating the configuration of a magnetic sensor according to the second embodiment of the present invention.
Figure 8A:
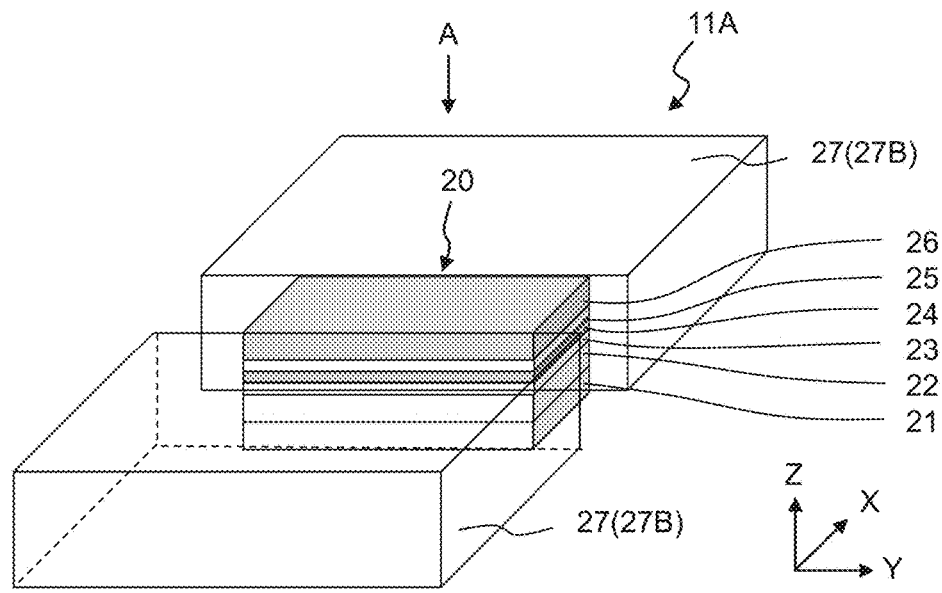
FIGS. 8A, 8B are views schematically illustrating the configuration of a MR element of the magnetic sensor shown in FIGS. 7A, 7B.
Figure 8B:
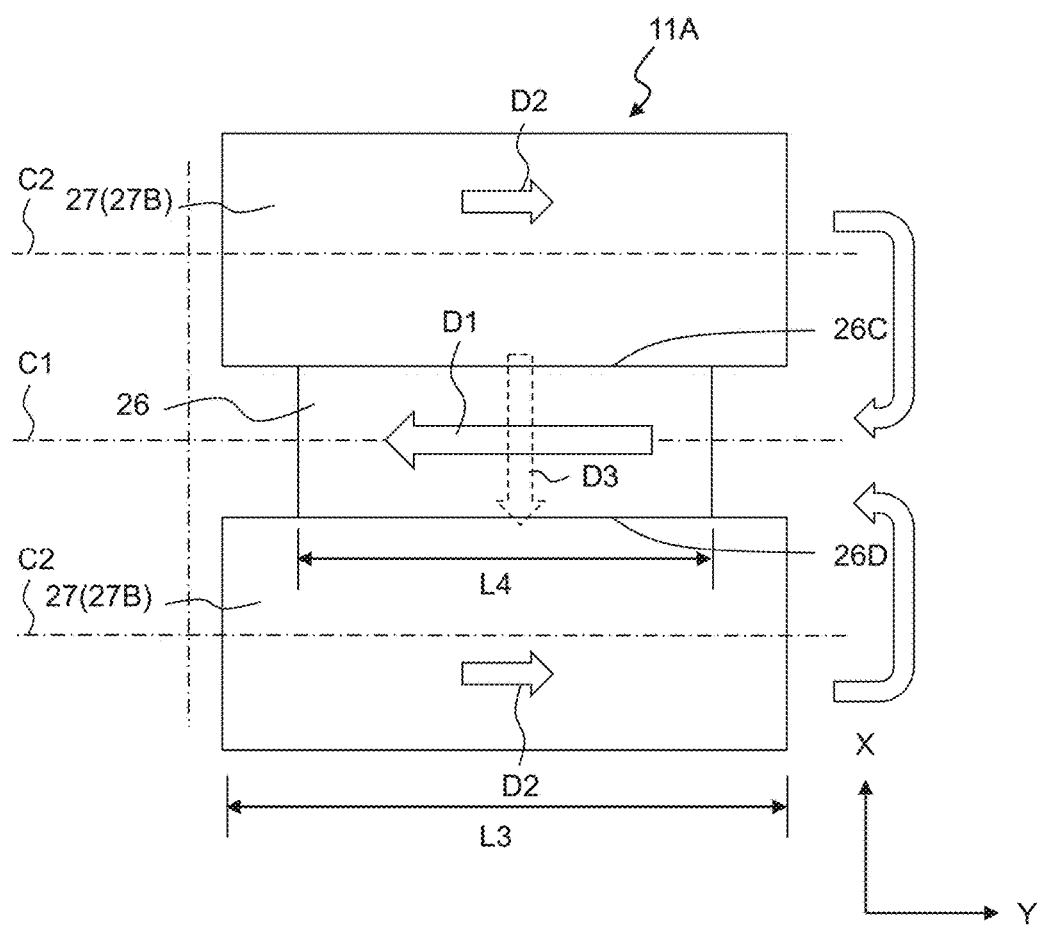

Next, the second embodiment of the present invention will be described. The present embodiment is the same as the first embodiment except for the configuration of bias magnets 27. FIG. 7A shows the schematic configuration of magnetic sensor 1A according to the second embodiment. FIGS. 8A, 8B are views similar to FIGS. 2A, 2B showing the configuration of first MR element 11A. In the present embodiment, a pair of bias magnets 27 faces both lateral sides 26C, 26D of free layer 26 with regard to initial magnetization direction D1, and central axes C2 thereof are substantially parallel to central axis C1 of free layer 26. In the specification, such bias magnets 27 are referred to as side bias magnets 27B. In the direction parallel to initial magnetization direction D1 (the Y direction), dimension L3 of side bias magnets 27 is larger than dimension L4 of free layer 26. Since the bias magnetic field of side bias magnets 27B turns around toward the lateral sides of side bias magnets 27B, as shown in FIG. 8B, magnetization direction D2 of side bias magnets 27B and initial magnetization direction D1 of free layer 26 are substantially antiparallel to each other in the present embodiment. On the other hand, the relationship between initial magnetization direction D1 of free layer 26 and magnetization direction D3 of reference layer 24 is the same as that in the first embodiment. Therefore, as shown in FIG. 7B, magnetic sensor 1A of the present embodiment works on the same principle as that of magnetic sensor 1 of the first embodiment.

Figure 9A:
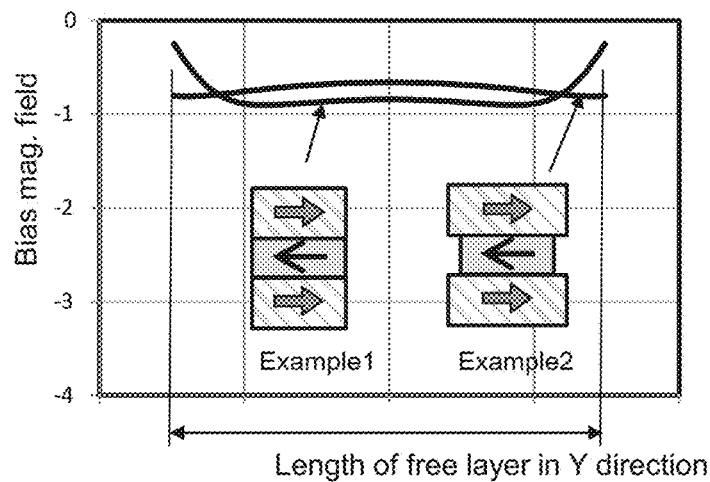
FIGS. 9A-9C are views illustrating a bias magnetic field that is applied to the free layer and the magnetizations of the free layer in the magnetic sensor according to the second embodiment.
Figure 9B:
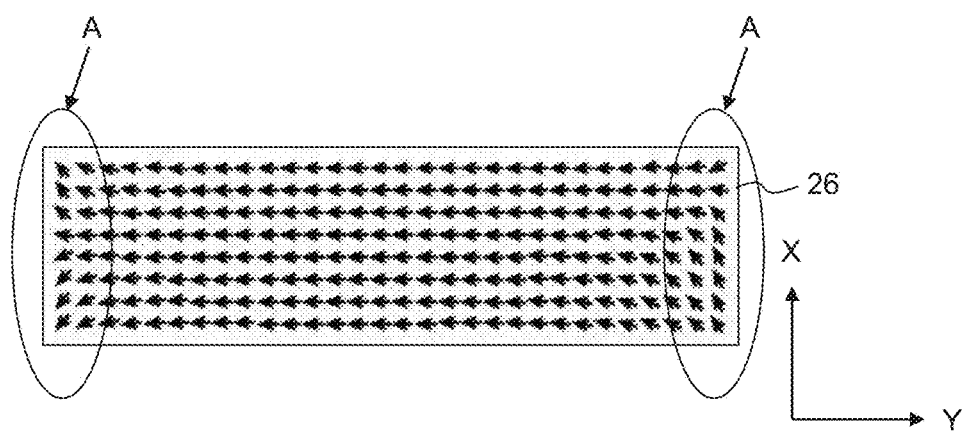
Figure 9C:
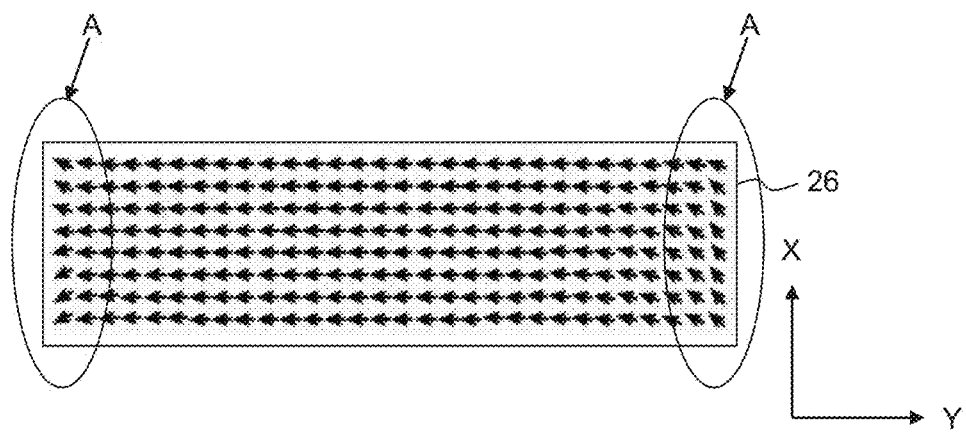

FIG. 9A shows the distribution of a normalized bias magnetic field in the longitudinal direction of free layer 26 in the present embodiment. As described above, since magnetization direction D2 of side bias magnets 27B is antiparallel to the direction of the bias magnetic field that is applied to free layer 26 in the present embodiment, the bias magnetic field is negative. The vertical axis of FIG. 6A and the vertical axis of FIG. 9A are normalized by the same reference value. In the first example, the dimension of side bias magnets 27B coincides with the dimension of free layer 26 in the direction parallel to initial magnetization direction D1 (the Y direction). In the second example, the dimension of side bias magnets 27B is larger than the dimension of free layer 26 in the direction parallel to initial magnetization direction D1 (the Y direction). FIG. 9B shows the distribution of the initial magnetization of free layer 26 in the first example, and FIG. 9C shows the distribution of the initial magnetization of free layer 26 in the second example. The initial magnetization at each position of free layer 26 is indicated by the arrows. In both examples, the initial magnetization direction is parallel to longitudinal direction Y of free layer 26 in most regions of free layer 26. In the first example, since the bias magnetic field is slightly weak at both ends of free layer 26 (portions A) with regard to the longitudinal direction, the magnetization direction tends to be directed in directions other than the longitudinal direction. In the second example, since free layer 26 is subjected to a relatively large bias magnetic field at both ends thereof with regard to the longitudinal direction, the magnetization direction further tends to be aligned in the longitudinal direction over the entire longitudinal length.

In the present embodiment, free layers 26 of some of the MR elements (first and second MR elements 11A, 12A) and free layers 26 of the other MR elements (third and fourth MR elements 13A, 14A) are also magnetized in directions substantially antiparallel to each other. That is, side bias magnets 27B of first and second MR elements 11A, 12A and side bias magnets 27B of third and fourth MR elements 13A, 14A are magnetized in directions substantially antiparallel to each other. Side bias magnets 27 B can be magnetized in different directions for each MR element in the same manner as in the first embodiment.

Third Embodiment

Figure 10A:
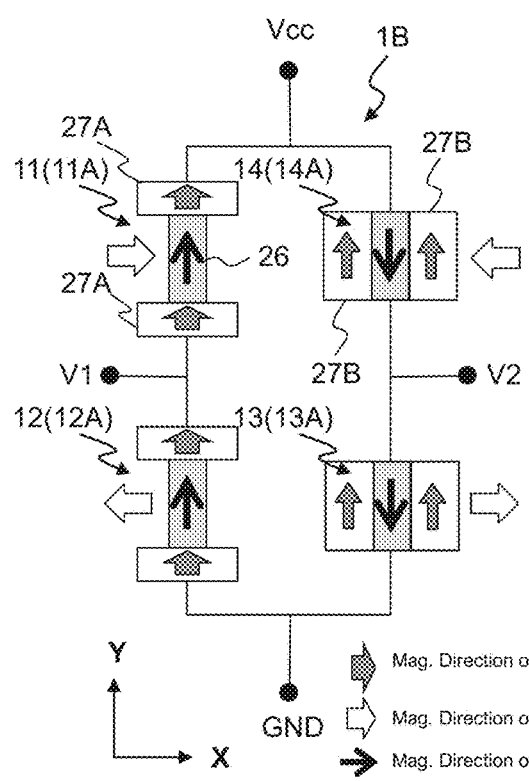
FIGS. 10A, 10B are views schematically illustrating the configuration of a magnetic sensor according to the third embodiment of the present invention.
Figure 10B:
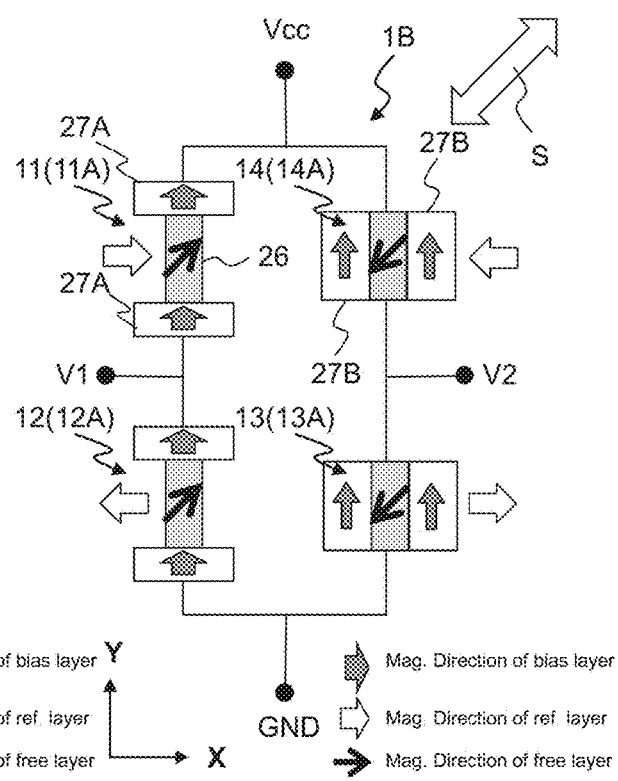

Next, the third embodiment of the present invention will be described. Magnetic sensor 1B according to the present embodiment is the same as the first embodiment except for the configuration of bias magnets 27. FIG. 10A shows the schematic configuration of magnetic sensor 1B according to the third embodiment. In the present embodiment, some of bias magnets 27 (bias magnets 27 of first and second MR elements 11A, 12A) are end bias magnets 27A, and the other bias magnets 27 (bias magnets 27 of third and fourth MR elements 13A, 14A) are side bias magnets 27B. That is, in the present embodiment, both end bias magnets 27A and side bias magnets 27B are provided. The configurations of end bias magnets 27A and side bias magnets 27B are the same as described in the first and second embodiments. In the present embodiment, end bias magnets 27A and side bias magnets 27B are magnetized in the same direction. Therefore, the present embodiment can realize a simplified manufacturing process. In addition, since it is not necessary to magnetize a high coersive material with a high voltage, the facility for magnetization can be simplified. Initial magnetization direction D1 of free layers 26 of first to fourth MR elements 11A to 14A is the same as that of the first embodiment, and the relationship between initial magnetization direction D1 of free layers 26 and magnetization direction D3 of reference layers 24 is also the same as that of the first embodiment. Therefore, as shown in FIG. 10B, magnetic sensor 1B of the present embodiment works in the same manner as magnetic sensor 1 of the first embodiment.

Fourth Embodiment

Next, the fourth embodiment of the present invention will be described. Magnetic sensor 10 according to the present embodiment is the same as that of the first embodiment except for the configuration of bias magnets 27. FIG. 11A shows the schematic configuration of magnetic sensor 10 according to the fourth embodiment. In the present embodiment, a pair of bias magnets 27 is end bias magnets that face both sides 26A, 26B of free layer 26 with regard to initial magnetization direction D1. However, unlike the first embodiment, both free layer 26 and a pair of bias magnets 27 of at least one MR element are parallelograms whose two sides that are adjacent to each other form angles of 45° or 135°, as viewed in the stacking direction Z of the MR element. As shown in FIG. 11C, central axes C2 of bias magnets 27 are inclined at angles of 45° relative to central axis C1 of free layer 26. In the specification, such bias magnets 27 are referred to as inclined bias magnets 27C. The shapes of free layer 26 and inclined bias magnets 27C are not limited to this, and may be substantial parallelograms whose two sides that are adjacent to each other form angles other than 90°. Central axes C2 of inclined bias magnets 27C may be inclined at angles θ ranging from 25° to 65° relative to central axis C1 of free layer 26. Central axes C2 of inclined bias magnets 27C of first and second MR elements 11A, 12A and central axes C2 of inclined bias magnets 27C of third and fourth MR elements 13A, 14A are symmetrical about line C4 that is located between first and second MR elements 11A, 12A and third and fourth MR elements 13A, 14A and that is parallel to central axes C1 of free layers 26, i.e. inclined in directions opposite to each other. Central axes C1 of all free layers 26 are directed in the same direction, and all inclined bias magnets 27C are magnetized in the same direction.

FIG. 11C schematically shows the magnetization of inclined bias magnets 27C. In the drawing, inclined bias magnets 27C are magnetized in magnetization direction D2. Therefore, if inclined bias magnet 27C is divided into fine magnetic domains, then each fine magnetic domain is magnetized such that the left side is the S pole and the right side is the N pole. Since inclined bias magnets 27C are inclined in mirror symmetry with respect to line C4, inclined bias magnet 27C on the left side has the S poles along the inclined surface that faces free layer 26, and inclined bias magnet 27C on the right side has the N poles along the inclined surface that faces free layer 26. For this reason, an upward oblique bias magnetic field occurs in inclined bias magnets 27C on the left side, and a downward oblique bias magnetic field occurs in inclined bias magnets 27C on the right side. Accordingly, bias magnetic fields having antiparallel components (the +Y direction and the −Y direction) can be applied to free layers 26 of first and second MR elements 11A, 12A and free layers 26 of third and fourth MR elements 13A, 14A. In the present embodiment, the initial magnetization direction of free layers 26 of first to fourth MR elements 11A to 14A is similar to that of the first embodiment, and the relationship between initial magnetization direction D1 of free layers 26 and magnetization direction D3 of reference layers 24 is also similar to that of the first embodiment. Therefore, the magnetic sensor 10 of the present embodiment works in the same manner as magnetic sensor 1 of the first embodiment, as shown in FIG. 11B.

EXAMPLE

Figure 12A:
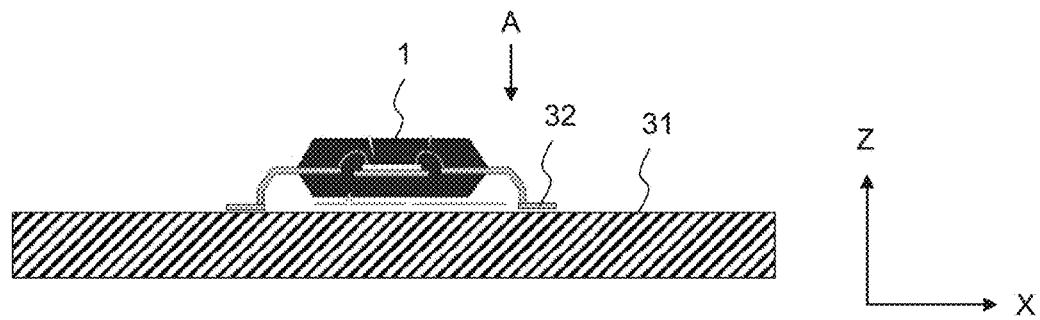
FIGS. 12A to 12C are views illustrating the method of applying a load to magnetic sensors according to an example and a comparative example.
Figure 12B:
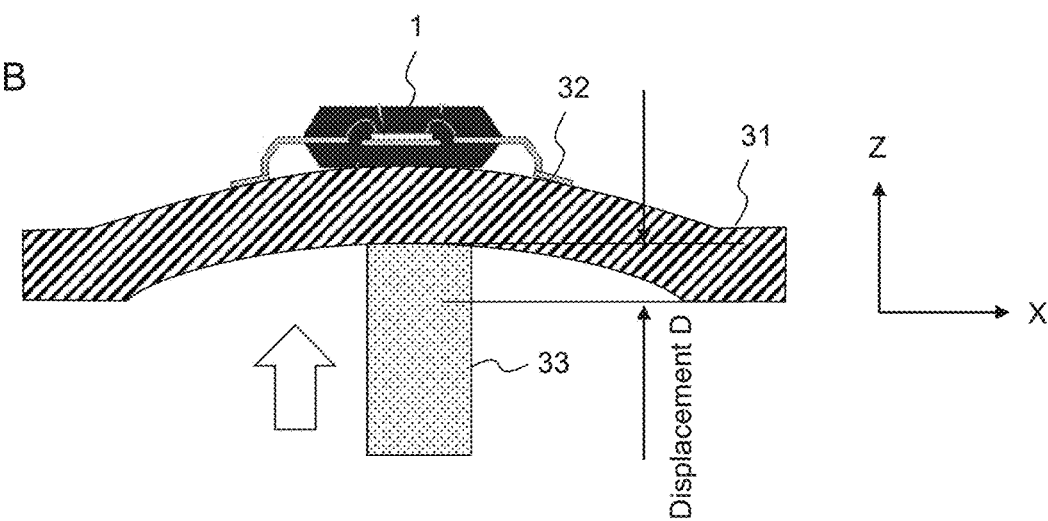
Figure 12C:
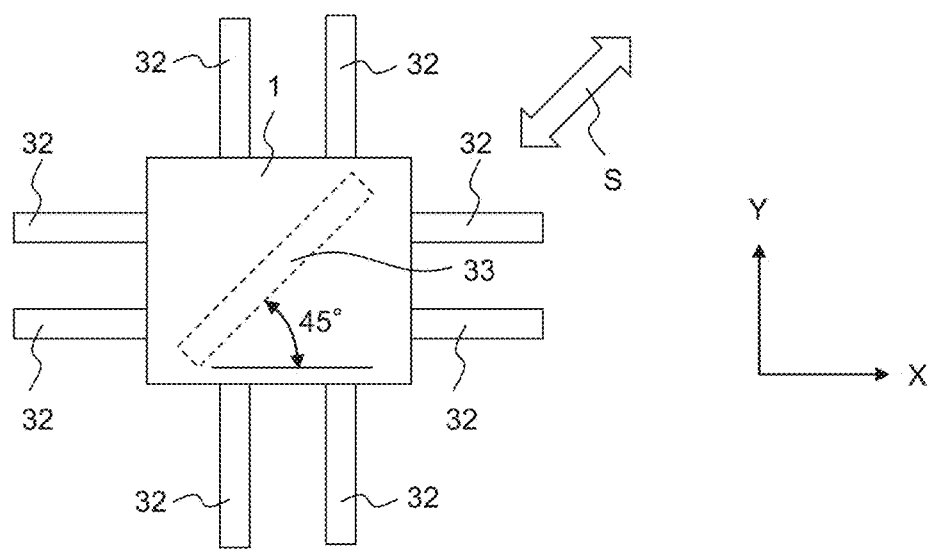

Simulated stress was applied to magnetic sensor 1 of the first embodiment, and outputs V1, V2 and V1-V2 were measured. As shown in FIG. 12A, magnetic sensor 1 was fixed to substrate 31 via lead wire 32. Next, as shown in FIG. 12B, substrate 31 was pressed in the +Z direction by means of plate 33 from the back side of substrate 31. Substrate 31 was bent upward, and lead wire 32 deforms to expand outward. As a result, tensile stress can be applied to magnetic sensor 1 via lead wire 32. FIG. 12C is a top view, as viewed from direction A in FIG. 12B, and as shown in the drawing, substrate 31 was pressed by plate 33 in the direction of 45° which maximizes the effect of external stress. Tensile stress S shown in FIG. 1B was simulated in this manner. Changes of outputs V1, V2 and V1-V2 were measured by changing displacement D of substrate 31 in the +Z-direction. A similar test was also performed on magnetic sensor 101 of the comparative example shown in FIG. 4B.

Figure 13A:
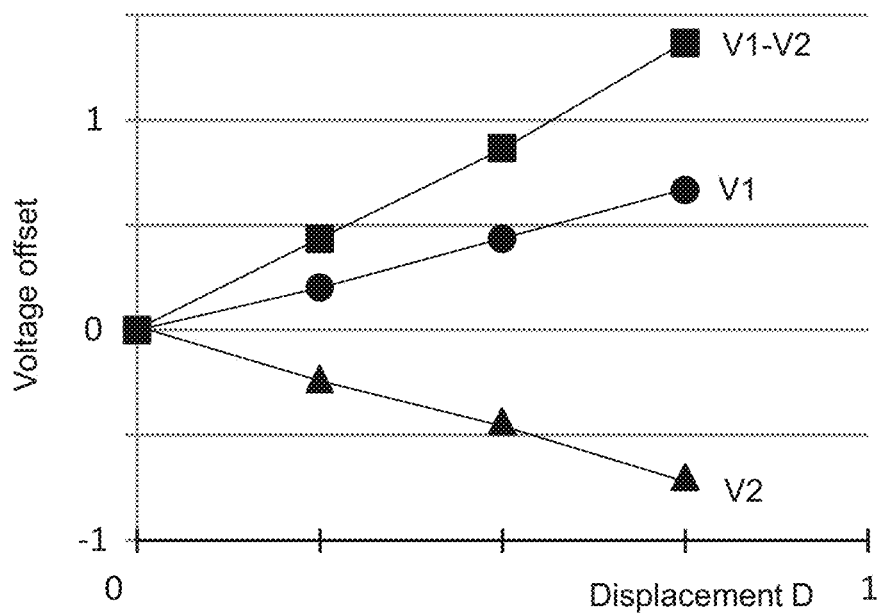
FIGS. 13A, 13B are graphs showing the relationship between the displacement and the offset of voltage in the comparative example and in the example, respectively.
Figure 13B:
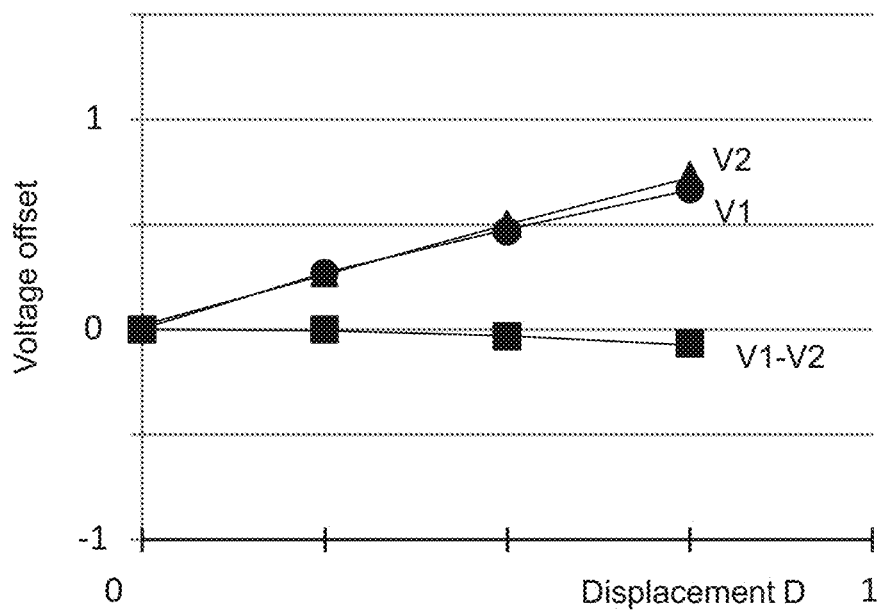
Figure 14A:
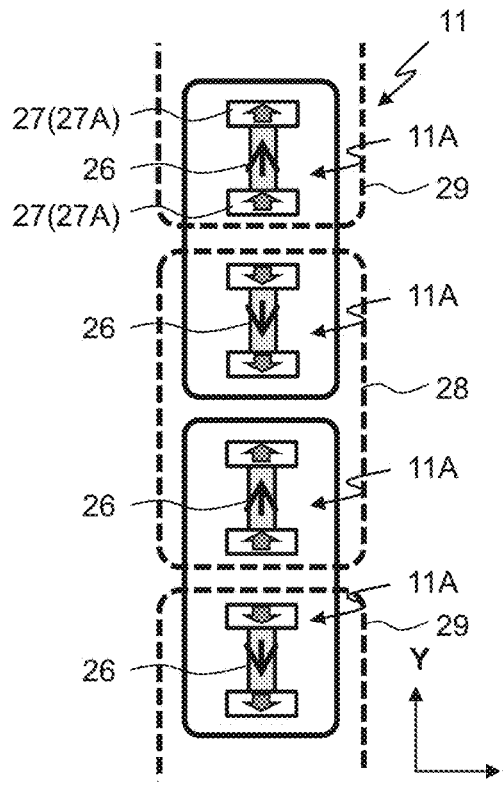
FIGS. 14A-14D are views schematically illustrating the configuration of magnetic sensors according to modifications of the present invention.
Figure 14B:
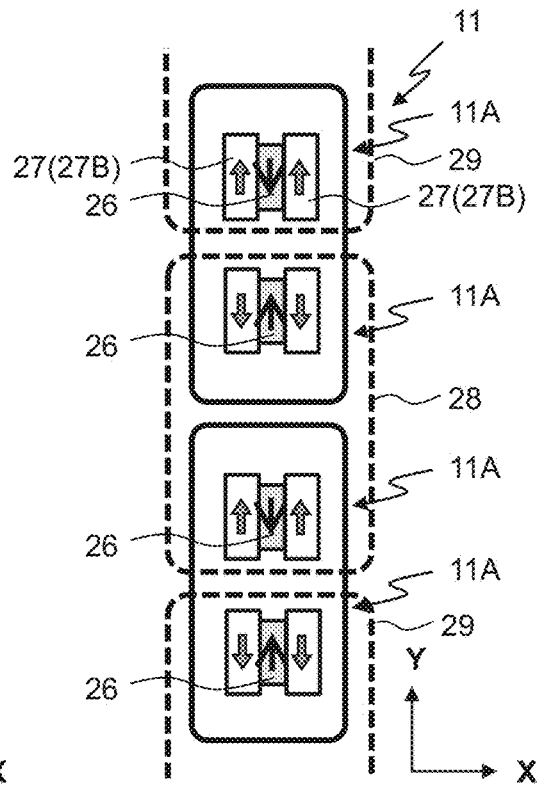
Figure 14C:
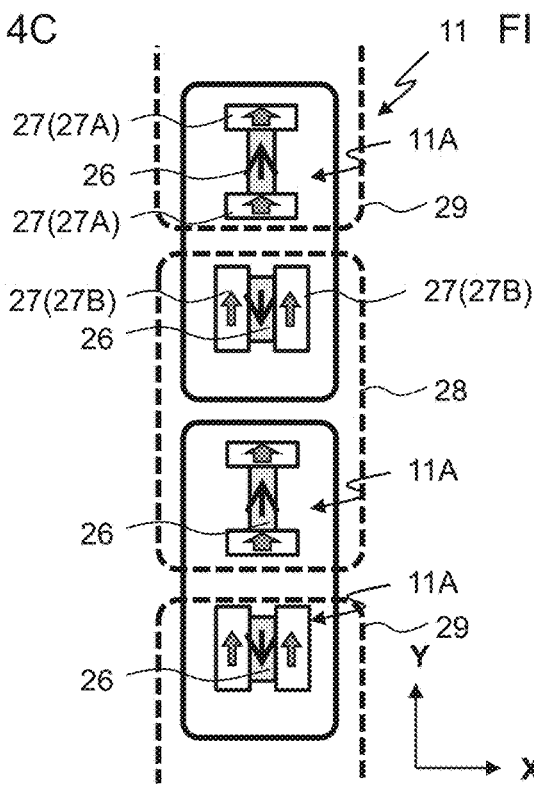
Figure 14D:
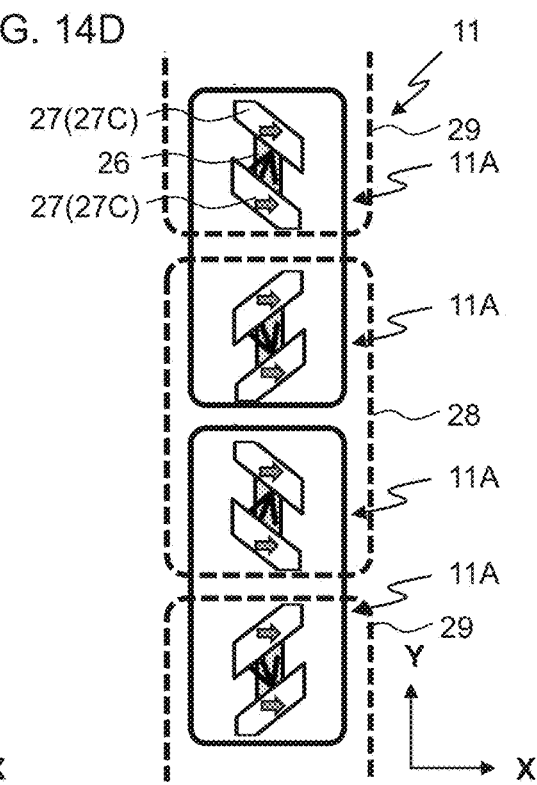

FIG. 13A shows the changes of outputs V1, V2 and V1-V2 versus displacement D in magnetic sensor 101 of the comparative example. As displacement D becomes large, the offsets of outputs V1, V2 increase, but for the reason described above, the offset of output V1 increases in the positive direction, and the offset of output V2 increases in the negative direction. Therefore, V1-V2 increases as displacement D becomes large. FIG. 13B shows the changes of outputs V1, V2 and V1-V2 versus displacement D in magnetic sensor 1 of the first embodiment. Since the offsets of both outputs V1, V2 increase in the positive direction, V1-V2 remains substantially unchanged when displacement D increases, and the offset is substantially limited.

FIGS. 14A to 14D show modifications of magnetic sensors 1, 1A, 1B and 10 of the first to fourth embodiments, respectively. Only first electric resistance element 11 is shown in these figures. First electric resistance element 11 has a plurality of MR sensors 11A that are connected in series. Specifically, two MR sensors 11A that are adjacent to each other are connected to each other via upper lead 28 that is connected to an upper electrode layer (not illustrated) or via lower lead 29 that is connected to a lower electrode layer (not illustrated). Two MR sensors 11A that are connected via upper lead 28 and two MR sensors 11A that are connected via lower lead 29 are connected in series. Upper lead 28 and lower lead 29 are separated from bias magnets 27. Although not illustrated, the same applies to second to fourth electric resistance elements 12 to 14. In some of MR sensors 11A that constitute first electric resistance element 11, initial magnetization direction D1 of free layers 26 is directed in the +Y direction (or approximately in the +Y direction), and in the other MR sensors 11A, initial magnetization direction D1 of free layers 26 is directed in the -Y direction (or approximately in the -Y direction). As long as the electric resistance of an electric resistance element increases or decreases under a specific stress, the electric resistance element may include a plurality of MR elements 11A in which initial magnetization direction D1 of some of free layers 26 and initial magnetization direction D1 of the other free layers 26 are directed in opposite directions.

Figure 15A:
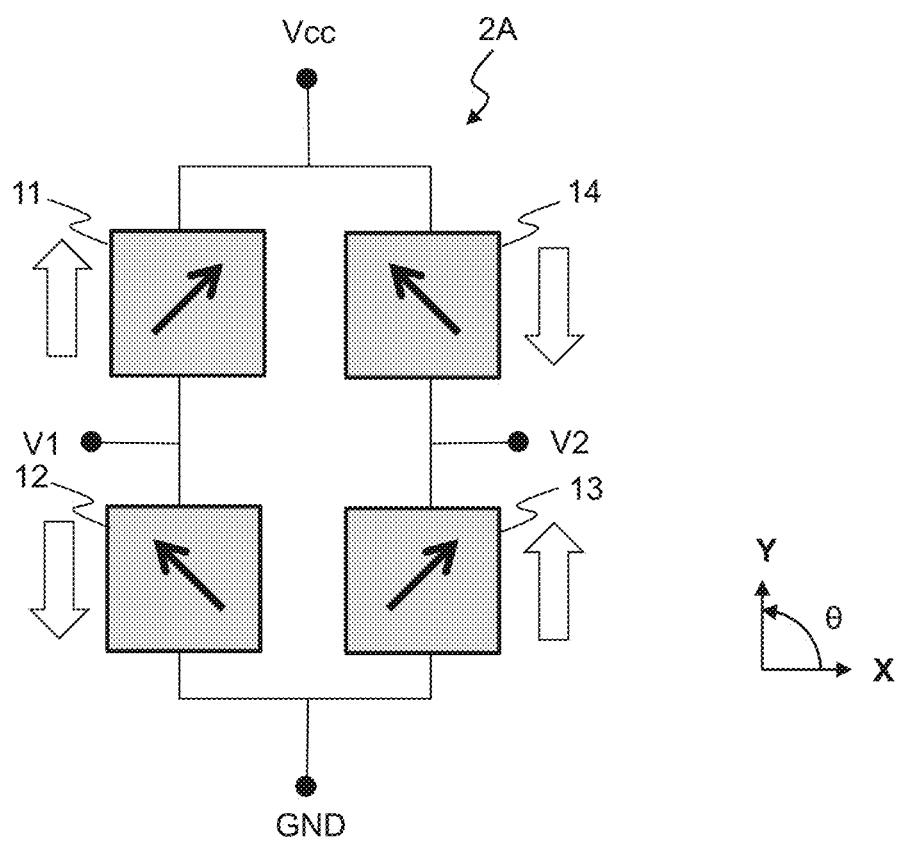
FIGS. 15A, 15B are views schematically illustrating the configuration of a direction detector.
Figure 15B:
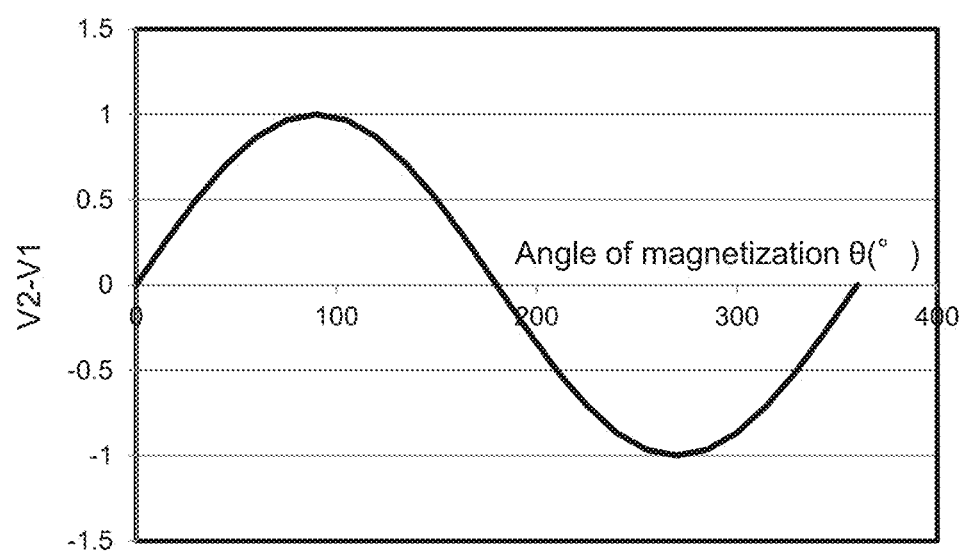

The magnetic sensor described above may be used, for example, as a direction detector for detecting a magnetic field in two in-plane directions of free layer 26 (the X direction and the Y direction), that is, as a compass. FIG. 15A shows the schematic configuration of direction detector 2A having magnetic sensor 1. Magnetic sensor 1 has four electric resistance elements 11 to 14, and each electric resistance element 11 to 14 has at least one MR sensor that is capable of detecting a magnetic field in the X and the Y directions. The configuration of electric resistance elements 11 to 14 is not limited as long as a magnetic field in the X and Y directions can be detected. For example, an MR sensor having a magnetically sensitive axis in the X direction and an MR sensor having a magnetically sensitive axis in the Y direction may be arranged in series, or at least one MR sensor having a magnetically sensitive axis that is inclined relative to the X and Y directions may be provided. The arrow in each electric resistance element 11-14 indicates the direction of a magnetic field that can be detected by each electric resistance element 11-14. FIG. 15B shows the change of V2-V1 versus angle θ of a magnetic field (see FIG. 15A). Since V2-V1 changes when direction detector 2A is rotated in the X-Y plane, the direction of θ=90° and the direction of θ=-90° can be detected based on the maximum value and the minimum value of V2-V1.

Figure 16A:
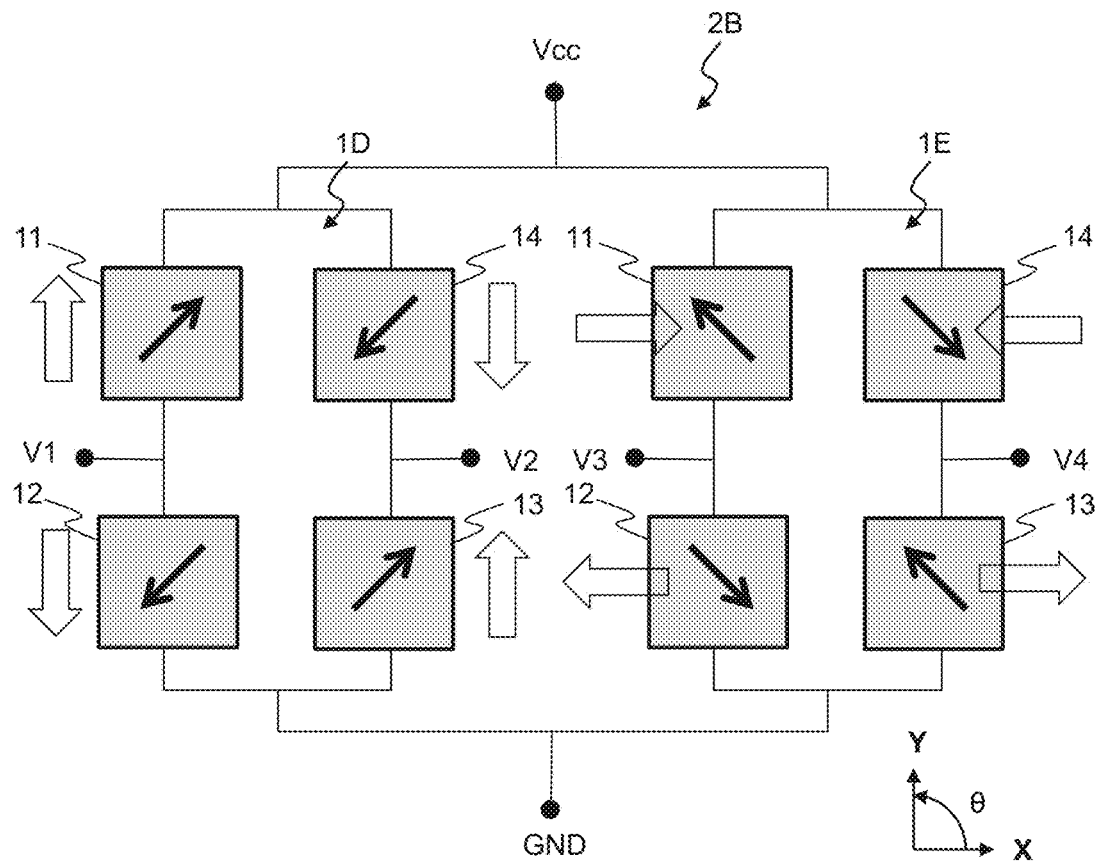
FIGS. 16A, 16B are views schematically illustrating the configuration of another direction detector.
Figure 16B:
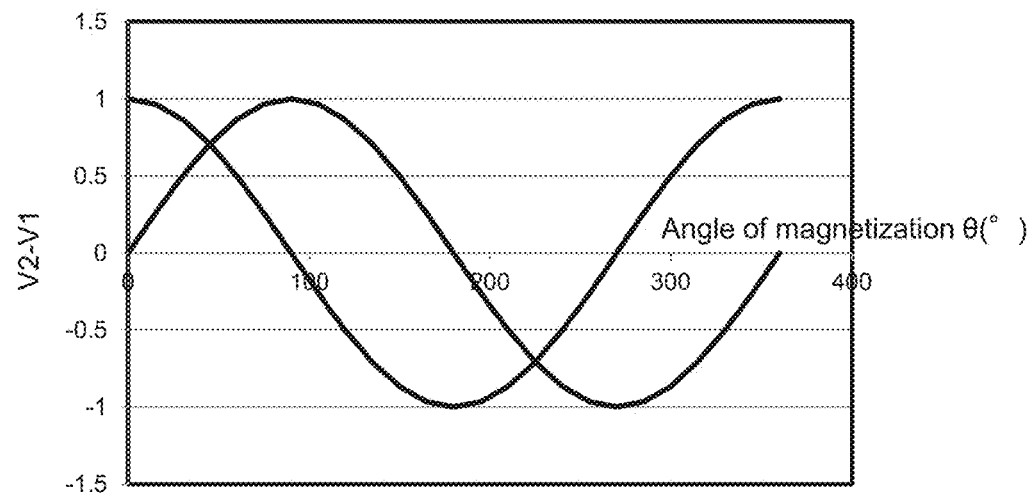

FIG. 16A shows the schematic configuration of another direction detector 2B that includes a magnetic sensor. In the present embodiment, two magnetic sensors 1D,1E are combined. First magnetic sensor 1D exhibits the same characteristics as the magnetic sensor shown in FIGS. 14A to 14D, and second magnetic sensor 1E has a configuration in which first sensor 1D is generally rotated 90° in the clockwise direction. FIG. 16B shows the change of V2-V1 versus angle θ of a magnetic field (see FIG. 16A). The output V3-V4 of second magnetic sensor 1E is shifted 90° relative to that of first magnetic sensor 1D. Therefore, the intensity of a magnetic field in the X and Y directions and angle θ of the magnetic field can be known by switching the readout of the outputs of first magnetic sensor 1D and second magnetic sensor 1E. Angle θ of the magnetic field can be obtained as θ=arctan $((V2\text{-}V1)_1/(V2\text{-}V1)_2)$, where $(V2\text{-}V1)_1$ is the output of first magnetic sensor 1D, and $(V2\text{-}V1)_2$ is the output of second magnetic sensor 1E. The direction detector of the present embodiment can be realized by combining, for example, magnetic sensors 1, 1A and 1B of the first to third embodiments.

In addition, although detailed descriptions are omitted, the magnetic sensor of the present invention may be applied not only to the above-described direction detector but also to a sensor for a magnetic encoder, a position sensor, a rotation angle sensor, a current sensor and a magnetic switch, as well as a module and a device that incorporate them.

Although certain preferred embodiments of the present invention have been shown and described in detail, it should be understood that various changes and modifications may be made without departing from the spirit or scope of the appended claims.

What is claimed is:

1. A magnetic sensor comprising a plurality of electric resistance elements that are connected to each other, wherein each electric resistance element includes at least an MR (magnetoresistive) element, each MR element has a free layer that is magnetized in an initial magnetization direction when no external magnetic field is applied and whose magnetization direction is changed from the initial magnetization direction when an external magnetic field is applied, wherein the plurality of electric resistance elements belongs either to a group in which electric resistance of the electric resistance elements increases when the magnetization direction of each free layer is rotated a predetermined angle in a same direction, or to a group in which the electric resistance decreases when the magnetization direction of each free layer is rotated the predetermined angle in the same direction, wherein the two groups are arranged such that a variation of an output of the magnetic sensor due to an increase of the electric resistance of the electric resistance elements of one group and a variation of the output of the magnetic sensor due to a decrease of the electric resistance of the electric resistance elements of another group are cancelled out.

2. The magnetic sensor according to claim 1, wherein the plurality of electric resistance elements comprises a first electric resistance element and a second electric resistance element that are connected in series and a third electric resistance element and a fourth electric resistance element that are connected in series, wherein a supply voltage is applied to the first and fourth electric resistance elements, and the second and third electric resistance elements are grounded, and output voltages are outputted from between the first electric resistance element and the second electric resistance element and from between the third electric resistance element and the fourth electric resistance element, respectively, wherein the first and fourth electric resistance elements belong to a same group and the second and third electric resistance elements belong to the other group.

3. The magnetic sensor according to claim 1, wherein each MR element has a reference layer whose magnetization direction is pinned relative to an external magnetic field, and in the MR elements of said one group, the initial magnetization direction of the free layer is rotated a first angle θ1 (where 0<θ1 <180°) in a first rotating direction relative to a magnetization direction of the reference layer, and in the MR element of said another group, the initial magnetization direction of the free layer is rotated a second angle θ2 (where 0<θ2 <180°) in a second rotating direction relative to the magnetization direction of the reference layer, wherein the second rotating direction is opposite to the first rotating direction.

4. The magnetic sensor according to claim 1, wherein the free layers of some of the MR elements and the free layers of the other MR elements are magnetized substantially antiparallel to each other.

5. The magnetic sensor according to claim 1, wherein each MR element has a pair of bias magnets that apply a bias magnetic field to the free layer, wherein the pair of bias magnets is either a pair of end bias magnets that face both ends of the free layer with regard to the initial magnetization direction thereof and whose central axes are substantially perpendicular to a central axis of the free layer, or a pair of side bias magnets that face both lateral sides of the free layer with regard to the initial magnetization direction thereof and whose central axes are substantially parallel to a central axis of the free layer.

6. The magnetic sensor according to claim 5, wherein the pair of bias magnets is a pair of the end bias magnets, and each end bias magnet is larger than the free layer in a direction perpendicular to the initial magnetization direction.

7. The magnetic sensor according to claim 5, wherein the pair of bias magnets is a pair of the side bias magnets, and each side bias magnet is larger than the free layer in a direction parallel to the initial magnetization direction.

8. The magnetic sensor according to claim 5, wherein a pair of the bias magnets of said some of the MR elements and a pair of the bias magnets of said other MR elements are formed of materials having a different coersive force.

9. The magnetic sensor according to claim 8, wherein a pair of the bias magnets of said some of the MR elements is made of CoPt or of a material in which at least one from among Cr, B and Ta is added to CoPt, and a pair of bias magnets of said other MR elements is made of FePt or of a material in which at least one from among Ni, Nb, Cu, Ag, Mo and Ti is added to FePt.

10. The magnetic sensor according to claim 5, wherein a pair of the bias magnets of said some of the MR elements is the end bias magnets, and a pair of the bias magnets of said other MR elements is the side bias magnets, wherein the end bias magnets and the side bias magnets are magnetized in a same direction.

11. The magnetic sensor according to claim 1, wherein each MR element has a pair of bias magnets that apply a bias magnetic field to the free layer, wherein a pair of the bias magnets of at least one of the MR elements faces both ends of the free layer with regard to the initial magnetization direction thereof, and central axes of the bias magnets are inclined at angles ranging between 25° and 65° relative to a central axis of the free layer.

12. The magnetic sensor according to claim 11, wherein both the free layer and the bias magnets are substantial parallelograms having two sides that are adjacent to each other and that form angles other than 90°, as viewed in a stacking direction of the MR element.

13. The magnetic sensor according to claim 11, wherein the at least one of the MR elements comprises at least two MR elements, and central axes of the free layers of the at least two MR elements are parallel to each other, wherein central axes of the bias magnets of said some of the MR elements and central axes of the bias magnets of said other MR elements are inclined in opposite directions.

14. The magnetic sensor according to claim 13, wherein all bias magnets are magnetized in a same direction.

15. The magnetic sensor according to claim 1, wherein each electric resistance element is a single MR element, a plurality of MR elements that are connected in series, or a plurality of MR element groups that are connected in parallel, wherein each MR element group has a plurality of MR elements that are connected in series.

16. The magnetic sensor according to claim 1, wherein the magnetic sensor detects a magnetic field in two in-plane directions of the free layer.

* * * * *